(12) United States Patent
Mund et al.

(10) Patent No.: US 7,326,446 B2
(45) Date of Patent: Feb. 5, 2008

(54) METHOD FOR COATING METAL SURFACES AND SUBSTRATE HAVING A COATED METAL SURFACE

(75) Inventors: Dietrich Mund, Obersüssbach (DE); Jürgen Leib, Freising (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/511,315

(22) PCT Filed: Apr. 15, 2003

(86) PCT No.: PCT/EP03/03872

§ 371 (c)(1),
(2), (4) Date: Apr. 12, 2005

(87) PCT Pub. No.: WO03/087423

PCT Pub. Date: Oct. 23, 2003

(65) Prior Publication Data

US 2005/0175846 A1   Aug. 11, 2005

(30) Foreign Application Priority Data

| Apr. 15, 2002 | (DE) | ............................ 202 05 830 U |
| May 23, 2002 | (DE) | ................................ 102 22 609 |
| May 23, 2002 | (DE) | ................................ 102 22 958 |
| May 23, 2002 | (DE) | ................................ 102 22 964 |
| Nov. 13, 2002 | (DE) | ................................ 102 52 787 |
| Jan. 16, 2003 | (DE) | ................................ 103 01 559 |

(51) Int. Cl.
*C23C 8/00* (2006.01)
*C08J 7/04* (2006.01)

(52) U.S. Cl. ...................... 427/585; 427/497; 427/504

(58) Field of Classification Search ................ 427/473, 427/504, 585
See application file for complete search history.

(56) References Cited

U.S. PATENT DOCUMENTS

| 3,953,652 A | * | 4/1976 | Addiss et al. ................ 428/412 |
| 4,104,418 A | | 8/1978 | Park et al. .................... 427/42 |
| 4,492,717 A | * | 1/1985 | Pliskin et al. ................ 438/618 |
| 4,737,252 A | | 4/1988 | Hoffman ................ 204/192.16 |
| 4,964,945 A | * | 10/1990 | Calhoun ........................ 216/40 |
| 5,451,548 A | * | 9/1995 | Hunt et al. .................. 427/596 |
| 5,543,775 A | * | 8/1996 | Huck .......................... 338/306 |
| 2002/0084885 A1 | * | 7/2002 | Wienand et al. .............. 338/25 |

FOREIGN PATENT DOCUMENTS

| CH | 387175 | 5/1965 |
| DE | 10222609.1 A1 | 5/2002 |
| DE | 10222958.9 A1 | 5/2002 |
| DE | 10222964.3 A1 | 5/2002 |
| DE | 10252787.3 A1 | 11/2002 |
| DE | 10301559.0 A1 | 10/2003 |
| EP | 334052 A2 * | 9/1989 |

OTHER PUBLICATIONS

Maissel, L. et al. Handbook of Thin Film Technology, 1970, McGraw-Hill, 7-42-7-43.*
XP-000819426, Sputtered Lead Silicate Glass Film for Multilevel Interconnections, Kato et al., 2419 Japanese Journal of Applied Physics Supplements, vol. 22 (1983) suppl. No. 22-1, Tokyo, Japan, pp. 167-170.
XP-002251599, Eliminating The Step in Etched via Holes Interrupted Sputter Glass Deposition, Bialko et al., vol. 20, No. 7 (1977), IBM Technical Disclosure Bulletin, p. 26.

* cited by examiner

*Primary Examiner*—Timothy Meeks
*Assistant Examiner*—David Turocy
(74) *Attorney, Agent, or Firm*—Ohlandt, Greeley, Ruggiero & Perle, L.L.P.

(57) ABSTRACT

A process for producing a coated substrate or a product having a coated substrate is provided. The process includes coating at least one metallic surface with a glass, the substrate being coated with an evaporation-coating glass at least on the metallic surface.

22 Claims, 8 Drawing Sheets

METHOD FOR COATING METAL SURFACES AND SUBSTRATE HAVING A COATED METAL SURFACE

BACKGROUND OF THE INVENTION

1. Field of the Invention

The invention relates in general terms to a process for coating metal surfaces, and in particular the invention relates to a process for coating metal surfaces with vitreous layers and to a substrate having a metal surface and a vitreous coating producible in accordance with the process.

2. Description of Related Art

Vitreous coatings have, inter alia, very good passivation and encapsulation properties. For example, glasses offer excellent protection against water, water vapor and in particular also against aggressive substances, such as acids and bases.

Vitreous layers for protecting metallic surfaces have long been known in the form of enamel. During enameling, an inorganic, solvent-free glass mixture is applied to the metal substrate and then fused.

However, a process of this type cannot deposit thin glass layers or glass layers with an accurately defined thickness on metallic substrates. Moreover, a process of this type which remelts a preliminary coating is suitable only for substrates which are sufficiently thermally stable. Moreover, it is therefore also not possible to produce an accurately structured vitreous layer on a substrate.

BRIEF SUMMARY OF THE INVENTION

Therefore, the invention is based on the object of providing a substrate with a metallic surface and a vitreous coating in particular on this surface which is improved with regard to the drawbacks outlined above, and of providing an improved process for producing coated substrates of this type and/or corresponding products.

This object is achieved in a most surprisingly simple way by the subject matter of the independent claims. Advantageous refinements and configurations are given in the respective subclaims.

Accordingly, the invention provides a process for producing a coated substrate and/or a product having a coated substrate which has at least one metallic surface, in which the substrate is coated with an evaporation-coating glass at least on the metallic surface.

A coated substrate according to the invention, which is producible in particular by the process according to the invention, accordingly comprises at least one metallic surface, the substrate being provided with an evaporation-coating glass layer on the metallic surface.

The evaporation-coating glass layer of a product of this type can serve as a passivation or encapsulation layer. Moreover, the evaporation-coating glasses are also distinguished by very good electrical insulation properties.

With regard to the barrier properties of evaporation-coating glass for the encapsulation of components and other substrates, reference is also made to the applications DE 202 05 830.1, filed on Apr. 15, 2002,
DE 102 22 964.3, filed on May 23, 2002;
DE 102 22 609.1, filed on May 23, 2002;
DE 102 22 958.9, filed on May 23, 2002;
DE 102 52 787.3, filed on Nov. 13, 2002;
DE 103 01 559.0, filed on Jan. 16, 2003;

in the name of the same Applicant, the content of disclosure of which is hereby expressly incorporated by reference.

With regard to the barrier properties of evaporation-coating glass layers, measurements have shown that with layer thicknesses of the evaporation-coating glass layer in the range from 8 µm to 18 µm, helium leak rates of less than $10^{-7}$ mbar 1 $s^{-1}$ or less than $10^{-8}$ mbar 1 $s^{-1}$ are reliably achieved. When using layers with a thickness of 8 µm and 18 µm, the measurements have even shown helium leak rates of between 0 and $2\times10^{-9}$ mbar 1 $s^{-1}$, and these upper limits are already substantially influenced by the measurement inaccuracy of the tests carried out.

The substrate with a metallic surface used may be either solid metallic substrates or substrates which are only partially metallic, such as for example appropriate composite materials. An example of a substrate of this type is a copper-coated plastic substrate as is used for printed circuit boards.

Moreover, on account of the coating according to the invention taking place at low or moderate temperatures, the invention makes it possible to produce products with a glass-coated metallic surface in which the melting point of the metal may also be lower than the temperatures which are customarily used for enameling. Accordingly, the process may also, for example, be applied to substrates comprising low-melting alloys and therefore also allows new combinations of materials to be used in products which can be produced in accordance with the invention.

Also, to carry out the process according to the invention, it is not absolutely imperative that the substrate or the metallic surface to be coated be planar. Rather, a coating comprising an evaporation-coating glass layer may also be applied without problems to curved and/or stepped metal surfaces. Accordingly, the process according to the invention can be used to produce a product or a coated substrate whose coated metallic surface is not planar.

To coat nonplanar surfaces of this type or, for example, to produce homogeneous coatings on large-area substrates, it may moreover be advantageous for the substrate to be moved with respect to the coating source during the coating operation. This movement may, inter alia, comprise a rotational movement, a translation movement or a nutational movement or also a combination of such movements.

According to a particularly preferred embodiment of the invention, the glass is deposited by evaporation coating, with the glass material being evaporated from a suitable source.

One advantage of evaporation coating is that the substrate which is to be coated does not have to be subjected to high thermal loads. During the deposition operation, the substrate can be kept in a temperature range between room temperature and approximately 150° C. Within this temperature range, there is generally no damage or oxidation whatsoever to the substrate.

In the context of the present invention, an evaporation-coating glass is to be understood as meaning a glass comprising an at least binary system of materials which can be deposited on a surface by evaporation coating. The evaporation-coating glass used may, inter alia, be a borosilicate glass comprising aluminum oxide and alkali metal oxide components, such as for example the evaporation-coating glasses of type 8329 or G018-189 produced by Schott Glas. Moreover, this glass has a coefficient of thermal expansion which is close to that of standard metallic substrates or can be matched to the coefficient of thermal expansion of the substrate by appropriate modification to the components.

It is also possible to use evaporation-coating glass of a different composition, in particular in a plurality of layers on top of one another, in which case the glasses may have different properties in terms of refractive index, density, hardness, etc.

Two glasses having the following compositions, in percent by weight:

| Components: | Glass1 | Glass2 |
|---|---|---|
| $SiO_2$ | 75-85% | 65-75% |
| $B_2O_3$ | 10-15% | 20-30% |
| $Na_2O$ | 1-5% | 0.1-1% |
| $Li_2O$ | 0.1-1% | 0.1-1% |
| $K_2O$ | 0.1-1% | 0.5-5% |
| $Al_2O_3$ | 1-5% | 0.5-5% | have proven to be particularly suitable evaporation-coating glasses for a coated substrate according to the invention and/or a product according to the invention.

The glasses which are preferably used in particular have the properties listed in the table below:

| Properties | Glass1 | Glass2 |
|---|---|---|
| $\alpha_{20\text{-}300}$ [$10^{-6}K^{-1}$] | 2.75 | 3.2 |
| Density (g/cm$^3$) | 2.201 | 2.12 |
| Transformation point [° C.] | 562° C. | 742 |
| Refractive index | $n_D$ = 1.469 | 1.465 |
| Hydrolytic resistance class in accordance with ISO 719 | 1 | 2 |
| Acid resistance class in accordance with DIN 12 116 | 1 | 2 |
| Alkali resistance class in accordance with ISO 695 | 2 | 3 |
| Dielectric constant $\epsilon$ (25° C.) | 4.7 (1 MHz) | 3.9 (40 GHz) |
| tan$\delta$ (25° C.) | 45 * $10^{-4}$ (1 MHz) | 26 * $10^{-4}$ (40 GHz) |

However, evaporation-coating glass can be deposited on the substrate not only by evaporation coating but also by various other vacuum coating processes. By way of example, the material can be deposited by sputtering.

The deposition of the glass layer by evaporation coating has the advantage over other vacuum deposition processes that it is possible to achieve significantly higher deposition or evaporation-coating rates. Tests have shown that evaporation-coating rates of more than 4 μm of layer thickness per minute can be achieved, and the glass produced is deposited with a firm bond onto the surface of the substrate without the need for an increased $H_2O$ content to effect a bonding action, as in the case of the low-temperature bonding (LTB) process.

The deposition rates which can be achieved by evaporation coating exceed the deposition rates achieved by other processes by a multiple. For example, in the case of single-component systems, such as for example silicon oxide, sputtering rates of just a few nanometers per minute are achieved.

For coating with the evaporation-coating glass by evaporation coating, it is recommended in particular to evaporate and deposit the material by electron beam evaporation. One of a number of advantages of electron beam evaporation is that the power transmitted by the electron beam can be concentrated on a relatively small area by focusing the beam. This makes it possible to reach locally high temperatures on the target of the evaporator, so that high flow rates can be achieved with relatively low powers. This at the same time also reduces the thermal loading caused by absorption of thermal radiation to which the substrate is exposed.

Thermal heating, for example of a crucible filled with the evaporation-coating material, can also be used to carry out the process according to the invention.

The process according to the invention can be used not only to produce homogeneous evaporation-coating glass coatings. Rather, in an advantageous refinement of the process according to the invention, the evaporation-coating glass can be deposited in structured form on the metallic surface, so that the substrate has a structured evaporation-coating glass layer after completion. It is in this context possible to produce both a lateral structuring and a vertical structuring of the coating.

Moreover, the production of structured glass layers is described in the prior German patent applications bearing application numbers 102 22 609.1 and 102 22 964.3, the content of which with regard to the structured coating with evaporation-coating glass layers is hereby incorporated in full in the subject matter of the present application.

In order in particular to produce lateral structures on the metallic surface of the substrate, the invention provides a configuration of the process according to the invention comprising the steps of:
  producing at least one negatively structured first coating on the metallic surface,
  depositing an evaporation-coating glass layer on the metallic surface which has been provided with the first coating,
  at least partially removing the first coating and the evaporation-coating glass layer on top of it.

The process is therefore based on applying a negative form of the structures which are to be produced, in the form of a structured first coating. Deposition of the evaporation-coating glass layer on the surface of the substrate which has been coated with the first, structured layer then produces the positive structures in the second layer. Then, in a subsequent step, the first coating and the evaporation-coating glass layer on top of it are at least partially removed, so that what remain are positive evaporation-coating glass structures. In the context of the present process, the terms positive and negative structures in general refer to structures which are at least partially complementary with respect to one another. This also means in particular that the at least one second coating may have both elevated and recessed structures.

The step of producing a negatively structured first coating on the metallic surface of the substrate may particularly advantageously comprise the step of uncovering regions of the at least one surface which is to be coated. In this way, during deposition the evaporation-coating glass layer comes into direct contact with that surface of the substrate which is to be coated, and an intimate, direct bond is created between the surface and the layer.

The step of producing a negatively structured first coating may, furthermore, advantageously comprise the step of resist-coating, in particular of resist-coating by means of spin coating and/or printing and/or spraying and/or electrodeposition, to produce a first coating. These techniques, inter alia, allow the production of coatings with a homogenous thickness. Moreover, to produce particular structures, the resist-coating may also be carried out in more than one step.

An advantageous refinement of the process according to the invention provides for the step of producing a negatively structured first coating to comprise the step of lithographic structuring of the first coating. Lithographic structuring is used in many ways, for example including in semiconductor manufacture. This structuring technique makes it possible to achieve high levels of accuracy of the structures combined, at the same time, with a high throughput. This process may, inter alia, also be combined with printing processes, such as screen printing or ink jet printing. For example, it is possible for relatively broad structures, such as for example the outlines of the components on a wafer, to be structured by printing on a photoresist and for the fine structure then to be produced by lithography. This refinement of the process according to the invention accordingly combines the advantages of photolithography with those of glass structuring.

To produce the positively structured evaporation-coating glass layer, the step of at least partially removing the first coating may advantageously comprise the step of lifting off regions of the evaporation-coating glass layer which cover the first coating. In this case, the regions of the evaporation-coating glass layer which cover the first coating are lifted off by removal of the first coating beneath the evaporation-coating glass layer and are thereby removed. This technique used to structure coatings is often also referred to as the "lift-off" process.

This process can be carried out in a simple way in particular if the evaporation-coating glass layer is deposited with a thickness which is less than the thickness of the first coating. In this way, the first coating remains accessible at the side edges of the structures of the coating even after deposition of the evaporation-coating glass layer and can then easily be removed again, for example by being dissolved using a suitable solvent, with the regions of the evaporation-coating glass layer which cover the structures of the first coating being lifted off with it.

A further variant of the process provides, as an additional process step, the at least partial uncovering of the first coating, so that this first layer is no longer hermetically covered by the second layer. This allows external access to the first coating.

To create access for the subsequent removal of the first coating, it is advantageous if the step of at least partially uncovering the first coating comprises the step of planarizing the coated metallic surface. In this case, the coated surface of the substrate is planarized until the evaporation-coating glass layer has been removed at the locations at which structures of the first, structured coating are to be found.

The partial removal of the evaporation-coating glass layer may expediently be effected by mechanical removal of material, in particular by means of grinding and/or lapping and/or polishing.

The process may additionally also comprise the step of aftertreatment of the positively structured second layer. The aftertreatment can be used, for example, to round edges of the structures. Suitable aftertreatment steps in this context are in particular wet-chemical and/or dry-chemical and/or thermal reflow. The structures can also be aftertreated by doping, in order, for example, to alter optical or electrical properties of the structures.

A further embodiment of the process according to the invention, with which a laterally structured evaporation-coating glass layer can be produced in a particularly simple way on the metallic surface, provides for the evaporation-coating glass to be applied by evaporation coating through a mask.

For this purpose, according to a variant of the process, the mask may be applied fixedly on the substrate, for example by adhesive bonding. According to a further variant, the mask is arranged between the coating source and the substrate.

To produce a structured evaporation-coating glass layer, a further configuration of the process according to the invention provides for the evaporation-coating glass layer to be structured following the coating operation. This can be effected in a simple way by structuring by means of local etching following the coating operation.

The local etching may, for example, be effected by photolithographic patterning of a photo-structurable coating applied to the evaporation-coating glass layer followed by the application of a suitable etchant by wet and/or dry etching. In this case, the etchant may advantageously also be selected in such a way that the metal surface acts as an etching stop.

The process according to the invention can be used not only to deposit single structured or uniform evaporation-coating glass layers. Of course, it is also within the scope of the invention for at least two evaporation-coating glass layers to be deposited on the substrate. These layers also do not have to have the same composition, and consequently by successive application of the layers it is also possible to produce a vertical structuring of the coating. Accordingly, a coated substrate which can be produced in this way comprises a multilayer coating having at least two evaporation-coating glass layers, which may also have different compositions.

The evaporation-coating glass layer may preferably be applied to the substrate with a thickness in a range from 0.01 µm to 1 mm.

According to an advantageous refinement, the composition of the evaporation-coating glass layer may be varied while the latter is being applied, so that accordingly a coated substrate having an evaporation-coating glass layer with a composition which varies in the direction perpendicular to the coated surface is obtained. By way of example, it is in this way possible to vary the coefficient of thermal expansion in the direction perpendicular to the substrate surface. In this way, it is possible even for evaporation-coating glasses and metallic substrates which have coefficients of thermal expansion which differ more considerably from one another to be matched to one another.

A further embodiment of the invention provides for the coating with an evaporation-coating glass layer to comprise the deposition of evaporation-coating material from at least two sources by co-evaporation. This refinement of the process is also suitable, for example, for producing varying compositions in the layer, so that materials properties, such as for example the refractive index or the temperature coefficient, vary continuously or in steps in the direction perpendicular to the surface.

Of course, a variation in the composition of the layer can also be achieved using other deposition processes, even using a single evaporation-coating source, for example by varying the heating power. Therefore, the step of depositing an evaporation-coating glass layer may with general advantage comprise the step of varying the composition of the material which is being deposited during deposition or the step of depositing a layer with a composition which varies in a direction perpendicular to the surface.

The co-evaporation may, for example, be carried out in such a way that two or more components of the evaporation-coating glass are evaporated from different sources and then, having been deposited on the surface of the substrate, form the evaporation-coating glass. However, it is also possible for the evaporation-coating glass to be deposited from a single source and then for additives to be introduced into the evaporation-coating glass layer using a further source.

Of course, it is also possible to vary the composition of the layer using other deposition processes, even using a single evaporation-coating source, for example by the heating power or the deposition rate being varied.

Furthermore, to achieve continuous, hermetically sealed evaporation-coating glass layers, it is advantageous if the surface roughness of the coated metallic surface is less than or equal to 50 µm.

For many metallic substrate materials which are to be coated, gentle heating of the substrate during coating with the evaporation-coating glass layer, for example to approximately 100° C., is also advantageous, in order to reduce thermal stresses after cooling.

Also, to achieve dense evaporation-coating glass layers with low levels of impurities, it is expedient if the pressure during coating in the coating chamber is at most $10^{-4}$ mbar, advantageously $10^{-5}$ mbar.

The coating of the substrate with an evaporation-coating glass layer may advantageously also comprise plasma ion assisted deposition (PIAD). In this process, an ion beam is additionally directed onto the substrate which is to be coated. The ion beam can be generated by means of a plasma source, for example by ionization of a suitable gas. The plasma additionally densities the layer and also removes any loosely adhering particles from the substrate surface. This leads to particularly dense, low-defect deposited layers.

In the text which follows, the invention is explained in more detail on the basis of exemplary embodiments and with reference to the drawings, in which identical and similar elements are provided with identical reference symbols and the features of various embodiments may be combined with one another.

DETAILED DESCRIPTION OF THE INVENTION

The following text refers firstly to FIGS. 1A to 1E, which use diagrammatic cross-sectional views to illustrate the process steps used to produce a coated substrate with a metallic surface which has been coated with a glass in accordance with a first embodiment of the invention.

The substrate 1 has two opposite surfaces 2 and 4, with at least the material of the surface 2 which is to be coated being metallic. The substrate 1 may, for example, be a solid metallic body or, for example, a composite material having a metallic layer whose surface forms the surface 2.

Figure 1A:
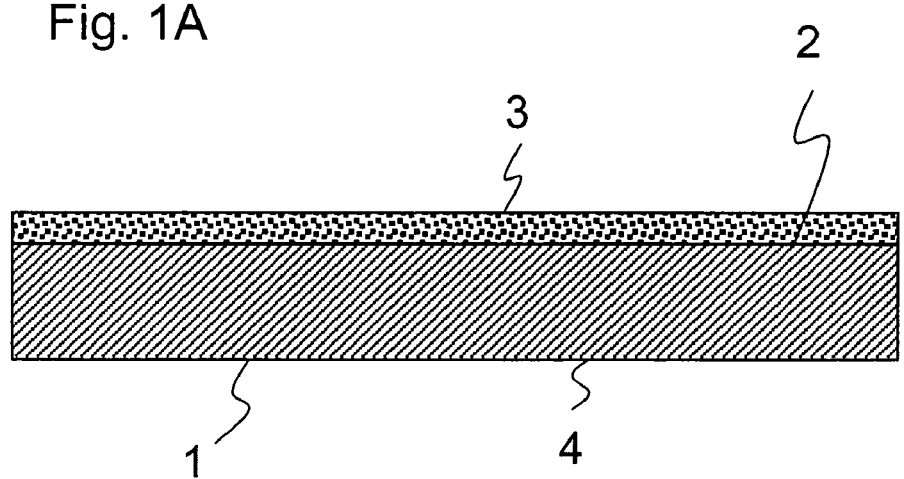
FIG. 1A to 1E use diagrammatic cross-sectional views to show process steps involved in the structured coating of substrates in accordance with one embodiment of the process according to the invention.

To produce a structured evaporation-coating glass coating, a first coating 3 is applied first of all to that surface 2 of the substrate 1, as shown in FIG. 1A, which is to be coated.

Figure 1B:
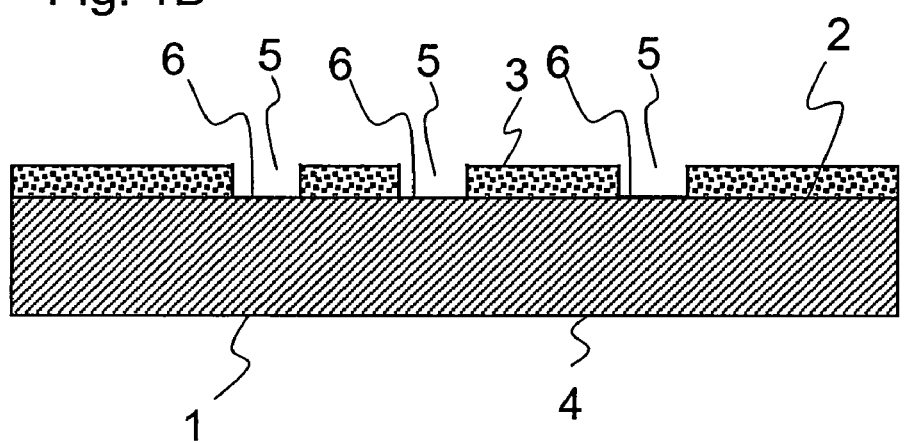

FIG. 1B shows a cross-sectional view through the substrate 1 following a further process step. In this step, structures 5 are introduced into the first coating. These structures 5 create a negative structuring which is complementary to the final structured coating. The structuring has been carried out in such a way that regions 6 of the metallic surface 2, which is to be coated, of the substrate 1 have been uncovered.

The structuring may, inter alia, be carried out by photolithography, for which purpose the first coating 3 comprises, for example, a photoresist into which the structures 5 have subsequently been introduced by exposure and developing.

According to a further variant of the process, the coating 3 is structured not following application, but rather directly when the layer is being applied. This can be achieved by the layer, for example, being printed onto the substrate 1 by means of a suitable printing process, for example by means of screen printing. In this variant of the process, the processing state of the substrate 1 shown in FIG. 1A is skipped. Of course, however, it is also possible for this variant to be combined with subsequent structuring, for example by a photoresist being printed in structured form onto the surface 2 of the substrate 1 and the structures which have been printed on then being structured further, for example in order to produce additional, finer structures. The state of the substrate shown in FIG. 1B concludes the step of producing a negatively structured coating.

Figure 1C:
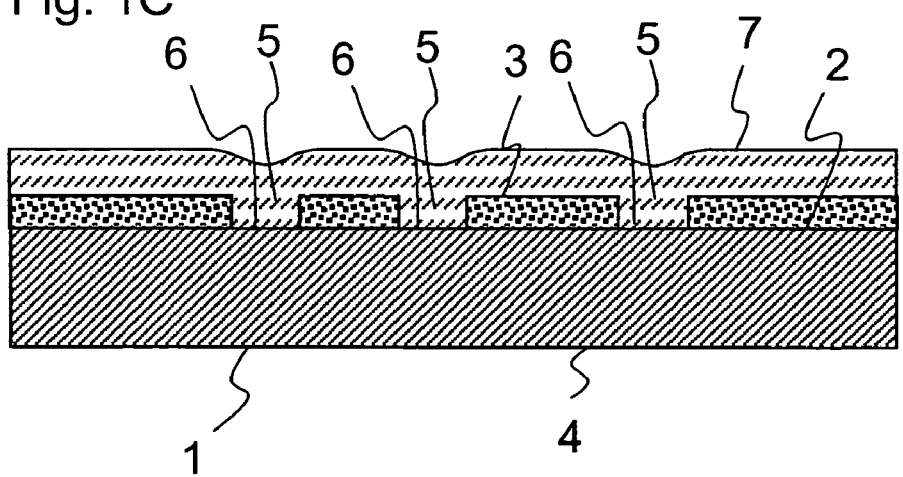

FIG. 1C shows the substrate following the step of coating that surface 2 of the substrate 1 which has been provided with the first coating 3 with an evaporation-coating glass layer 7. The coating with an evaporation-coating glass layer 7 is preferably carried out by electron beam evaporation. The evaporation-coating glass layer 7 covers the uncovered regions 6 and the first coating 3.

Figure 1D:
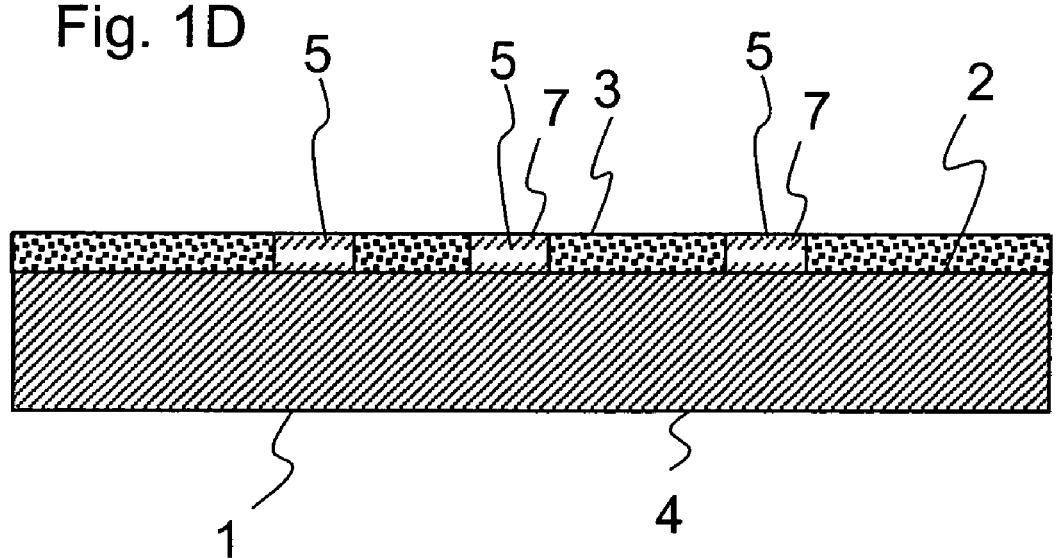

FIG. 1D shows the substrate after the subsequent step of uncovering the first coating 3. In this variant of the process, the coating was uncovered by planarizing the coated metallic surface 2. For this purpose, the coated surface was plane-ground until the layer 7 on top of the first coating had been removed. As a result, the first coating beneath it was uncovered again.

Figure 1E:
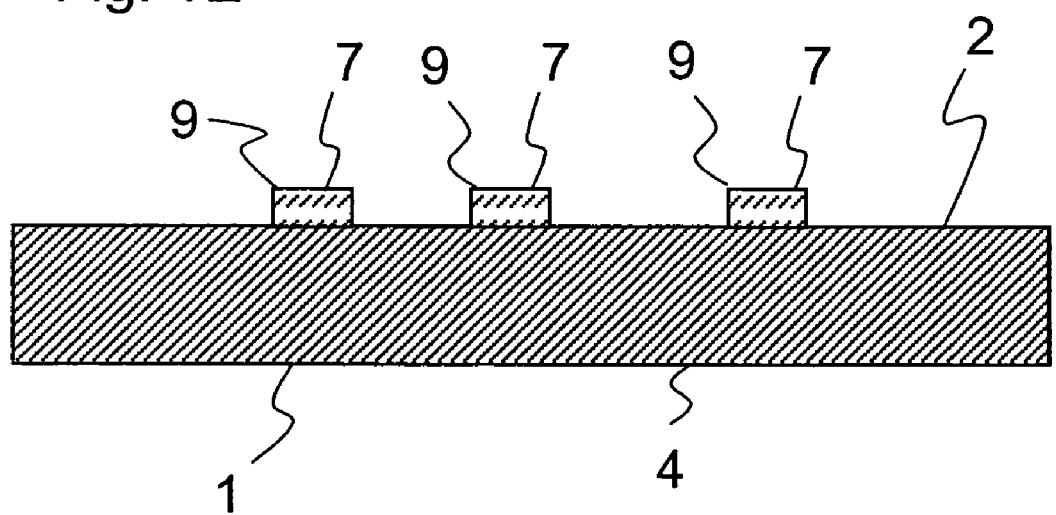

FIG. 1E shows a subsequent process step in which the first coating has been removed. The evaporation coating of the evaporation-coating glass layer 7 onto the negatively structured first coating 3 and the removal of the first coating 3 after it has been uncovered ultimately.leave behind a positively structured evaporation-coating glass layer 7 on the substrate. The structures 9 of the positively structured layer 7 cover those regions 6 which were uncovered or were not covered by the first coating 3.

The removal of the first, negatively structured coating can be effected, for example, by dissolving it in a suitable solvent or by wet-chemical or dry-chemical etching. Incineration or oxidation in an oxygen plasma may also advantageously be used to remove the coating.

Figure 2A:
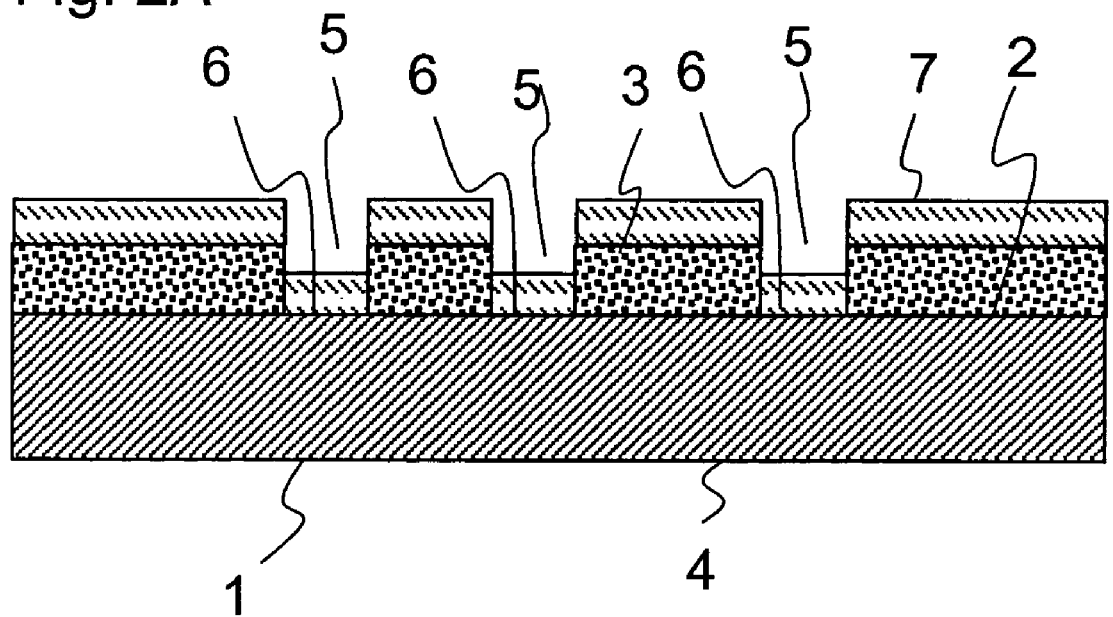
FIGS. 2A and 2B show a variant on the process steps illustrated with reference to FIG. 1C to 1E, FIG. 3A to 3F use diagrammatic cross-sectional views to show process steps in accordance with an embodiment of the invention for the multilayered structured coating of a substrate, FIG. 4 diagrammatically depicts a device for carrying out the process according to the invention.
Figure 2B:
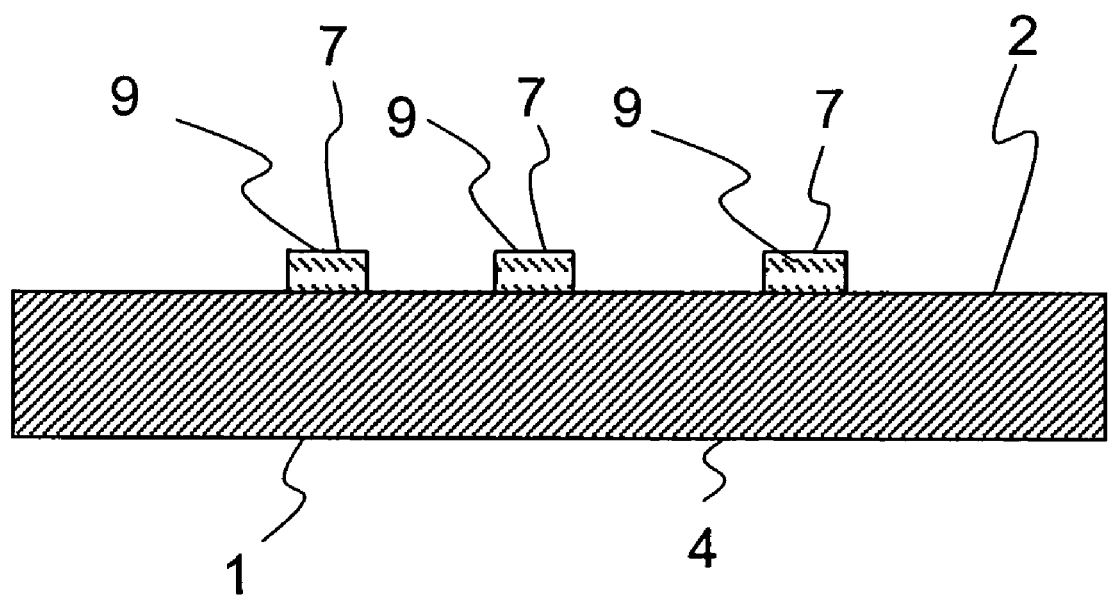

The following text, with reference to FIGS. 2A and 2B, explains a preferred variant of the process steps shown with reference to FIGS. 1C and 1E. In this variant of the process, first of all the substrate 1 is prepared, as has been shown with reference to FIGS. 1A and 1B, by application of a structured first coating 3. The coating 3 once again has negative structures 5 which leave clear regions 6 of the first surface 2. Once again, an evaporation-coating glass layer 7 is applied to the surface of the substrate which has been prepared in this manner, for example is applied by electron beam evaporation from a glass target comprising evaporation-coating glass. In this case, however, the layer thickness of the layer 7 is selected in such a way that the layer 7 is not continuous. This is achieved, according to the invention, by the thickness of the evaporation-coating glass layer 7 being less than the thickness of the first coating. This phase of the process is shown in FIG. 2A.

The first coating 3 can then be removed directly without any need for it to be uncovered, for example by the planarization shown with reference to FIG. 1C, since the fact that the evaporation-coating glass layer 7 is not continuous means that access is retained to the first coating 3 at the side edges of the structures. Those regions of the layer 7 which are on top of the first coating 3 are lifted off during removal of the first coating 3 and are thereby removed.

The result which remains, as shown in FIG. 2B, is once again a structured evaporation-coating glass layer 7 with positive structures 9.

In an additional step, it is also possible for a bonding layer which covers the top sides, remote from the substrate surface, of the structures 9, to be applied to the structures 9 of the structured second layer 7 of the embodiments shown in FIG. 1E or 2B. A bonding layer of this type may, for example, comprise a seed layer for subsequent metallization or, for example, a layer of adhesive.

FIGS. 3A to 3F show a further embodiment of the process according to the invention, this embodiment serving to produce multilayer structured evaporation-coating glass layers.

For the sake of clarity, FIGS. 3A to 3F do not specifically illustrate some of the process steps which have been explained with reference to FIGS. 1A to 1E and/or 2A and 2B.

Figure 3A:
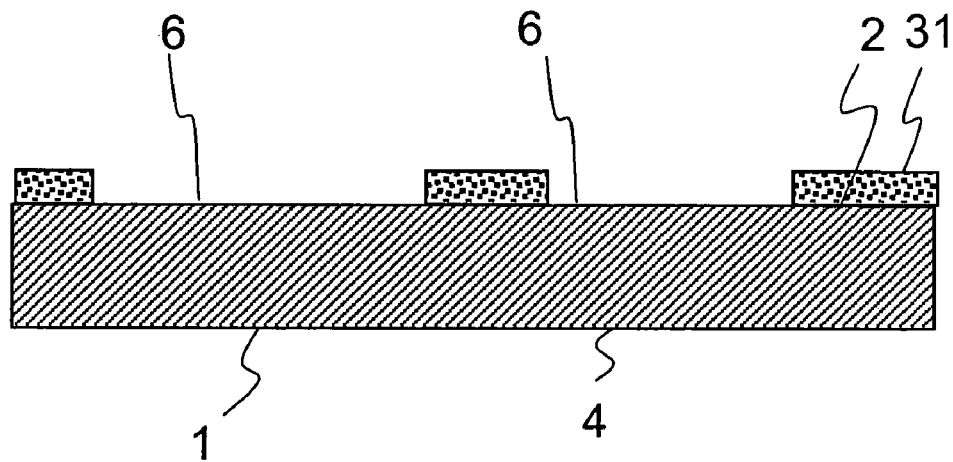

FIG. 3A shows a substrate 1 on which a structured first coating 31 has been produced on the metallic surface 2. Therefore, the processing state of the substrate 1 substantially corresponds to that shown in FIG. 1B.

Figure 3B:
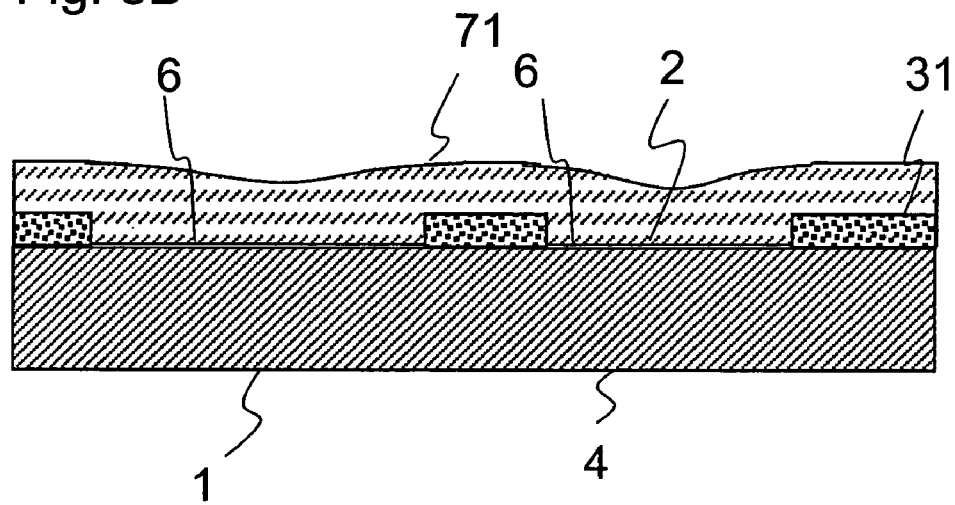

FIG. 3B shows the result of the subsequent step of depositing an evaporation-coating glass layer 71 on the surface which has been provided with the first coating 31.

Figure 3C:
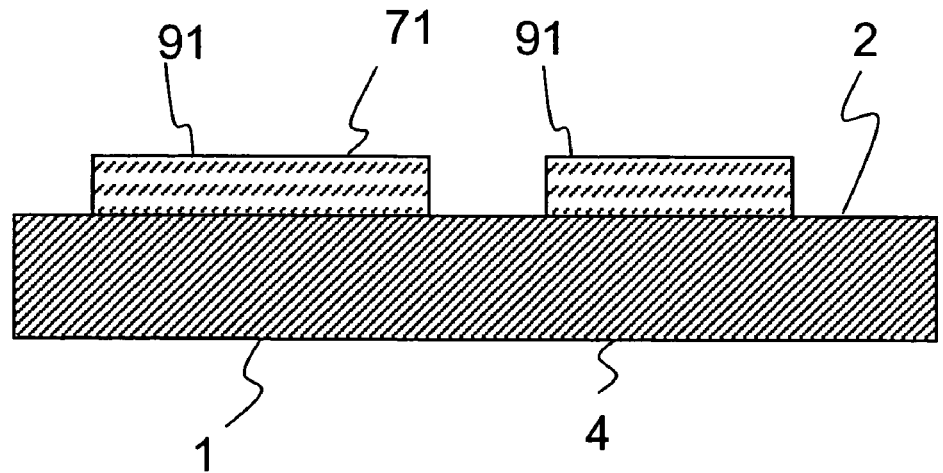

Then, the layer 71 is once again removed by grinding and planarization of the coated surface of the substrate 1 in the regions which have been coated with the layer 31, and the layer 31 which is thus uncovered is removed, so that what remains is a positively structured evaporation-coating glass layer 71 with structures 91. This processing state is illustrated in FIG. 3C.

Figure 3D:
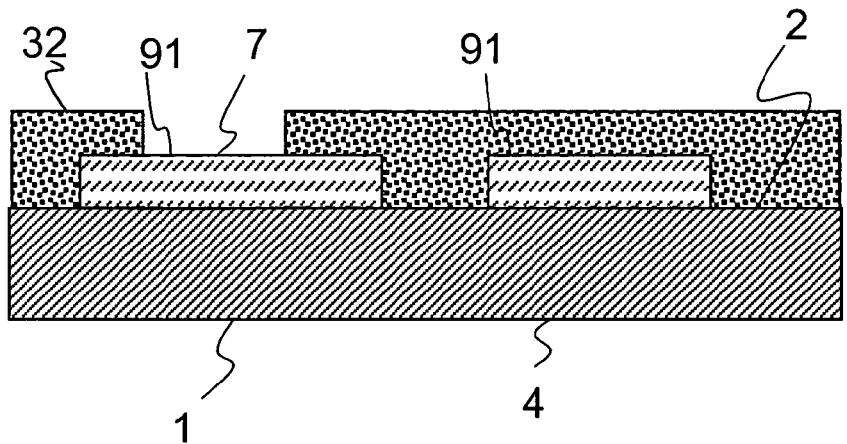
Figure 3E:
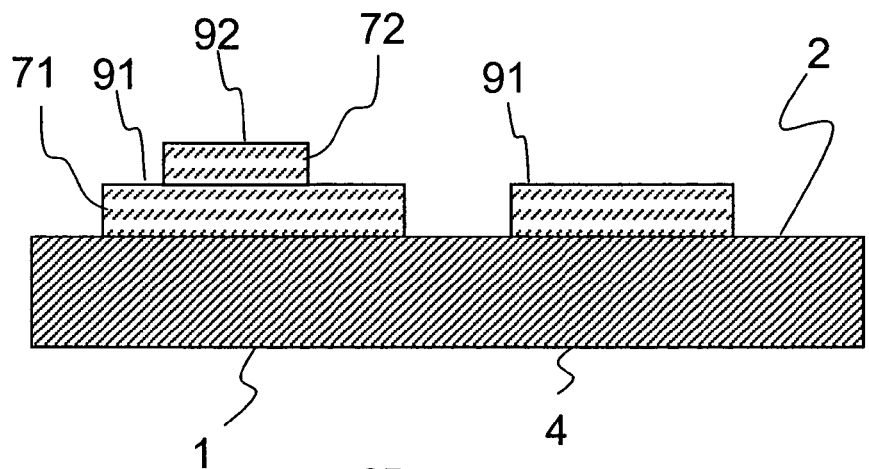

To apply further layers of a multilayer coating, a further, first structured coating 32 is produced, as shown in FIG. 3D, on the surface which has been coated in this way. As is shown with reference to FIG. 3E, the negative structures 52 of the further first coating 32 are located on the structures 91 of the structure evaporation-coating glass layer 71. Then, yet another evaporation-coating glass layer 72 is applied, the layer 32 is uncovered by grinding down the layer 72 on top of it, and then the layer 32 is removed.

The multilayer application of evaporation-coating glass layers may advantageously be realized in accordance with the process steps illustrated with reference to FIGS. 2A and 2B.

Figure 3F:
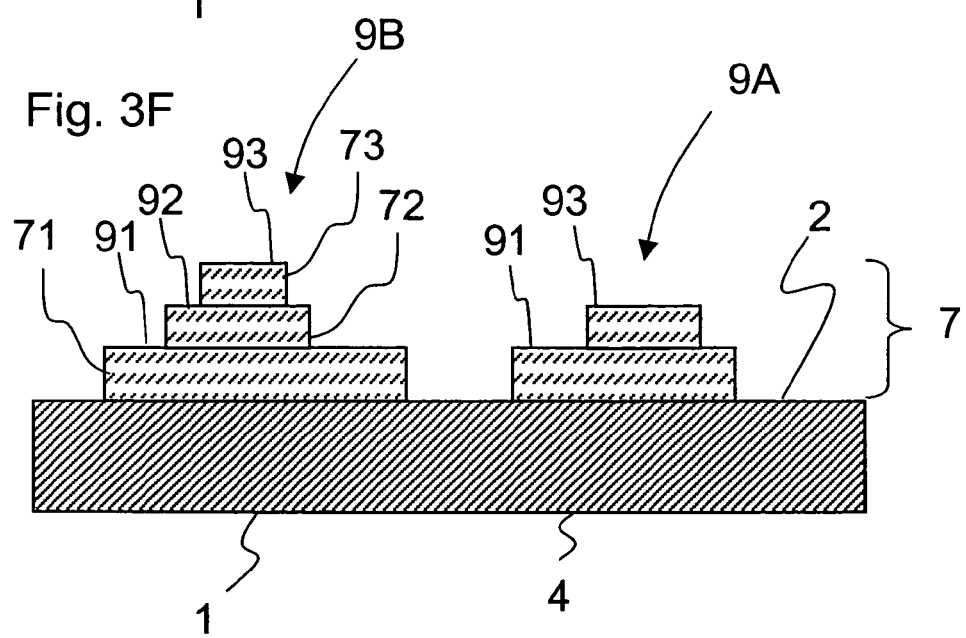

These process steps may if appropriate be repeated more than once. FIG. 3F shows the substrate 1 following the application of yet another evaporation-coating glass layer 73 with structures 92. The plurality of individual layers 71, 72 and 73 as a whole in turn form a structured evaporation-coating glass coating 7 with structures 9A and 9B. These structures 9A and 9B may if required also be produced in such a way that individual structures do not include evaporation-coating glass material from each coating of the individual layers 71, 72, 73.

Moreover, the individual layers can also have different compositions and layer thicknesses. It is also possible for other materials which, for example, are not vitreous to be combined with evaporation-coating glass individual layers. By way of example, it is possible to apply structured individual layers which, for example, comprise metal, plastic or semiconducting substances.

Figure 4:
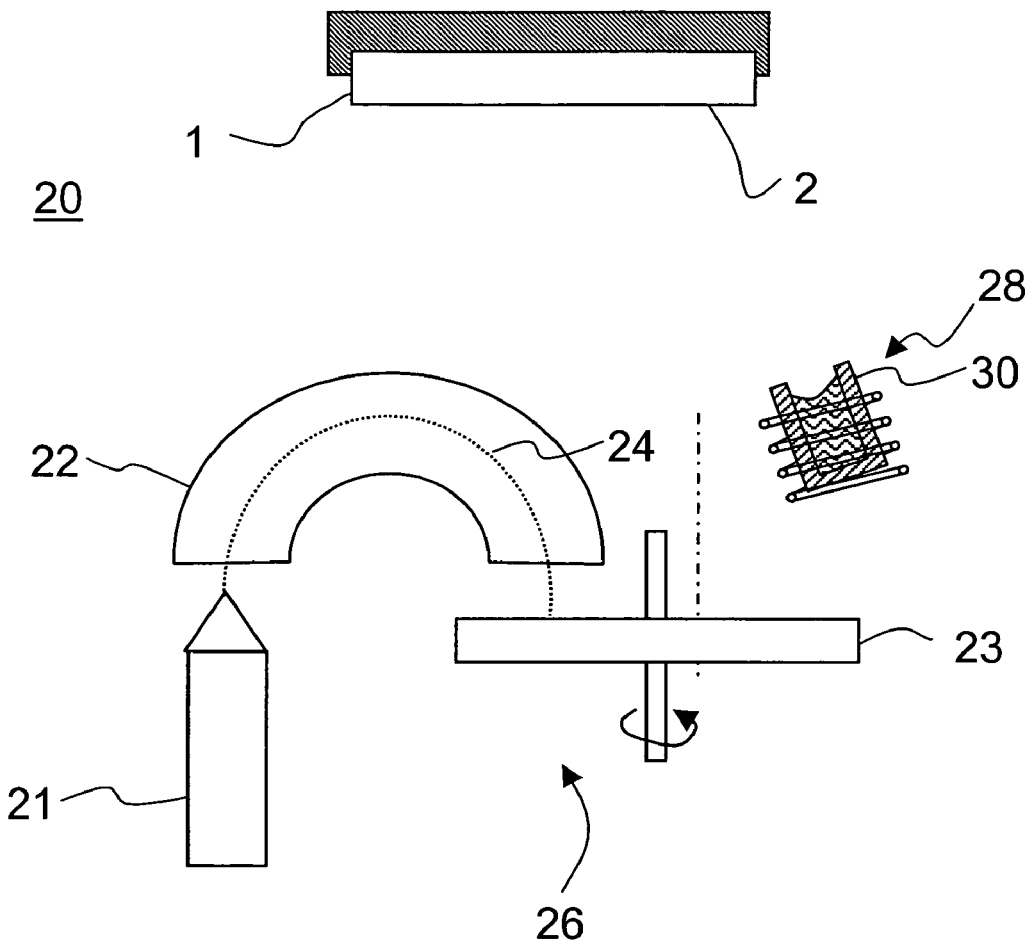

FIG. 4 shows a diagrammatic view of an evaporation-coating device, which is denoted overall by reference numeral 20, for carrying out the process according to the invention. The apparatus 20 specifically comprises an electron beam evaporator 26.

The electron beam evaporator 26 has an electron beam generator 21, a beam diverter device 22 and a glass target 23 which, in operation, is impinged on by an electron beam 24 emitted by the electron beam generator 21.

A substrate 1 which is to be coated, having a metallic surface, is arranged in such a way in the apparatus that the metallic surface to be coated faces a glass target 23.

The glass evaporates at the impingement location of the electron beam and is subsequently deposited on the exposed parts of the surface of the substrate 1 opposite the impingement point of the electron beam on the target.

To allow the glass of the target 23 to be evaporated as uniformly as possible, the target 23 is rotated. In addition, a sweeping motion can be imparted to the beam 24, for example in the radial direction of the target 23.

During the evaporation-coating operation, the pressure in the apparatus 20 is held at $10^{-4}$ mbar or lower during coating. This has proven expedient in order to produce dense evaporation-coating glass layers with a low defect density.

During evaporation coating, the substrate can also be heated slightly, for example to approximately 100° C., by means of a suitable device, which for many substrate materials prevents or reduces thermal stresses which occur following the evaporation coating step.

Furthermore, a further embodiment of the apparatus provides a device (not shown in FIG. 4) for moving the substrate with respect to the coating source or the electron beam evaporator 26, in order, for example, to increase the homogeneity of the evaporation-coating glass layer or to allow nonplanar substrates to be coated without any shadowing effects.

The evaporation-coating apparatus 20 may additionally also comprise a plasma source for generating an ion beam which, in operation, is directed onto the metallic surface of the substrate which is to be coated, in order for the substrate to be coated with a layer of glass by means of plasma ion assisted deposition (PIAD).

The apparatus 20 may also be equipped with one or more further sources for the co-evaporation of additives or other evaporation-coating glasses. For this purpose FIG. 4 shows, by way of example, an additional source 28. This may, for example, likewise be an electron beam evaporator or may also, as indicated in FIG. 4, comprise a crucible 30 which is heated by electron collisions and is filled with the evaporation-coating material.

The material which is co-evaporated from this source 28 can be used to influence the composition or stochiometry of the evaporation-coating glass layer. In particular, the evaporation-coating or deposition rate of the source 28 during coating can be altered relative to the deposition rate of the electron beam evaporator 26, resulting in a composition of the evaporation-coating glass layer which varies in a direction perpendicular to the coated metallic surface 2.

Figure 5:
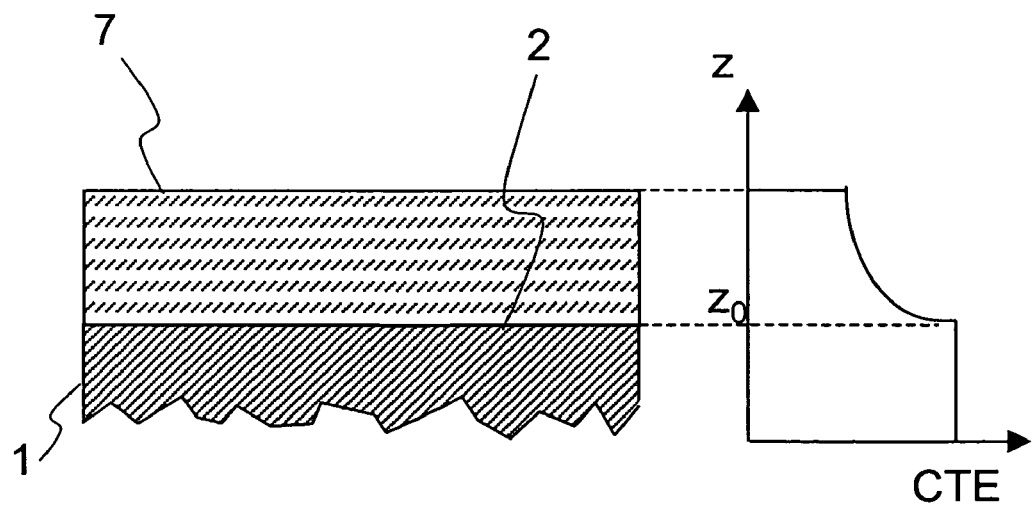
FIG. 5 shows a cross-sectional view through a coated substrate according to the invention with a vertically varying composition of the evaporation-coating glass layer.

An example of a product of this type having a substrate 1 with a coated metallic surface 2 is illustrated in FIG. 5. According to the invention, an evaporation-coating glass layer 7 has once again been applied to the surface 2 of the substrate 1. In this case, an additive was co-evaporated from a further source and the deposition rate, and/or the flow from this source during evaporation coating, was varied. The additive is selected in such a way that it influences the coefficient of thermal expansion of the evaporation-coating glass layer.

The graph shown next to the diagrammatic cross-sectional illustration of the coated substrate presents the coefficient of thermal expansion CTE as a function of a direction z perpendicular to the surface 2. The flow from the further source was selected in such a way and varied over the course of time during the evaporation coating in such a way that the coefficient of thermal expansion of the evaporation-coating glass layer and of the material of the metallic surface substantially coincide at the position zo at the surface of the substrate 1. This makes it possible to achieve good dia-thermal matching of the evaporation-coating glass layer to the metallic surface.

Figure 6:
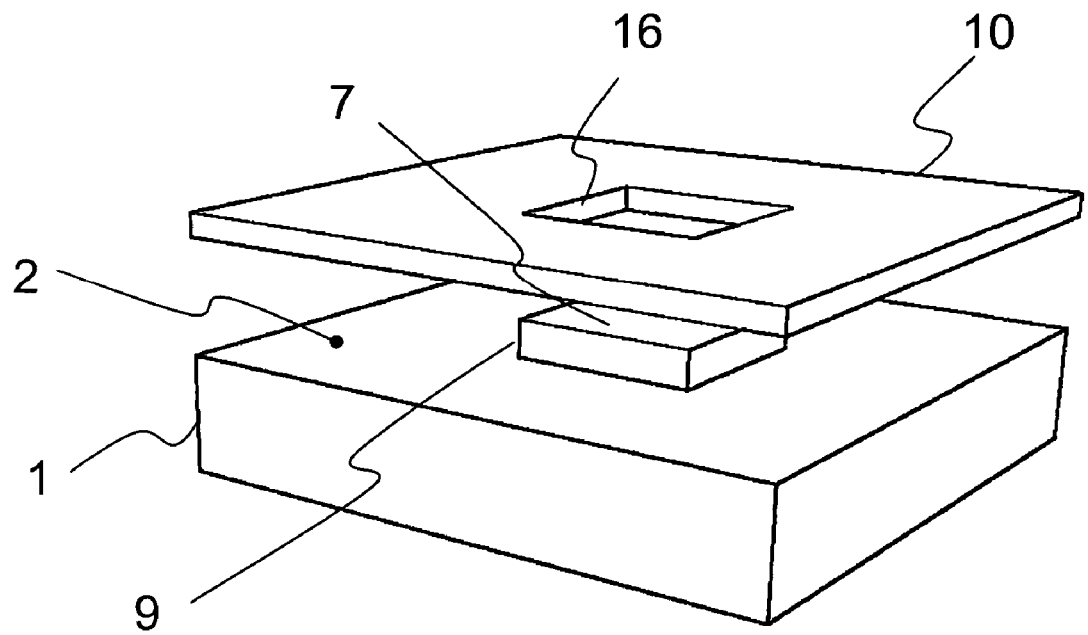
FIG. 6 shows an arrangement for carrying out a further embodiment of a process according to the invention for structured coating with an evaporation-coating glass layer.

FIG. 6 diagrammatically depicts an arrangement for carrying out a further embodiment of a process according to the invention for structured coating with an evaporation-coating glass layer. According to this embodiment of the process, a mask 10 is arranged between the surface 2 of the substrate 1 which is to be coated and the source, which is not illustrated in FIG. 6. The mask 10 has openings 16 or cutouts corresponding to the intended shape and position of the structures 9 of the evaporation-coating glass layer 7, of which, as an example, one opening is illustrated.

To obtain well-defined structures 9, it is advantageous if the mask 10 is arranged as close as possible to the surface 2 of the substrate 1. The coating with the evaporation-coating glass layer is then carried out by evaporation coating onto the surface 2 through the mask 10.

The text which follows refers to FIGS. 7A to 7D, which use cross-sectional views to illustrate process steps in accordance with yet another embodiment for producing a structured evaporation-coating glass layer.

This process is based on the metallic surface of the substrate first of all being coated with a homogeneous, unstructured evaporation-coating glass layer and this layer subsequently being structured.

Figure 7A:
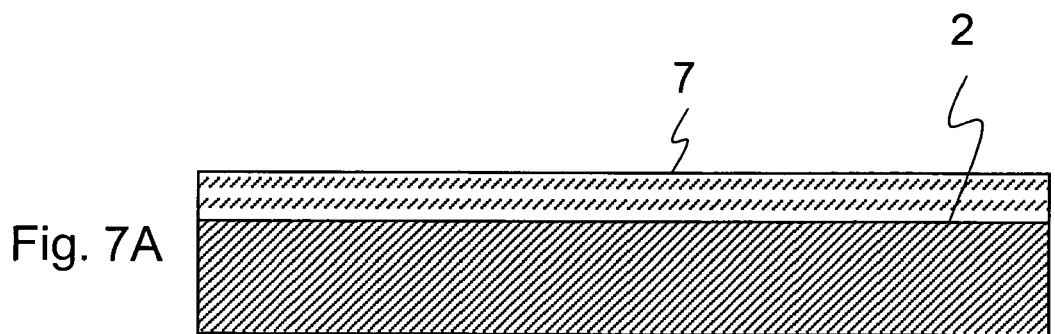
FIG. 7A to 7D show process steps in accordance with yet another embodiment for producing a structured evaporation-coating glass layer.
Figure 7B:

Accordingly, first of all, as shown in FIG. 7A, the substrate 1 is coated on the metallic surface 2 with an evaporation-coating glass layer 7. Then, as illustrated in FIG. 7B, a photo-structurable layer 34, for example a suitable photoresist, is applied to the evaporation-coating glass layer 7.

Figure 7C:
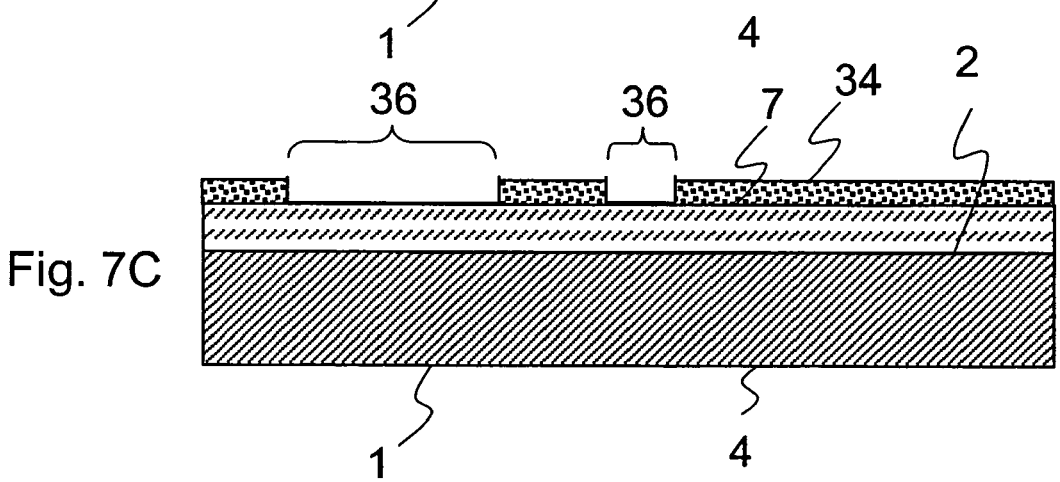

The layer 34 is then photolithographically structured in a further process step, so that, as shown in FIG. 7C, regions 36 of the evaporation-coating glass layer 7 beneath it are uncovered.

Finally, a suitable etchant, which attacks only the evaporation-coating glass layer, can be used. Accordingly, as a result of the covering, structured layer 36, the evaporation-coating glass layer beneath it is locally etched in the uncovered regions 36. Moreover, the metallic surface 2 in this case acts as an etching stop.

Figure 7D:
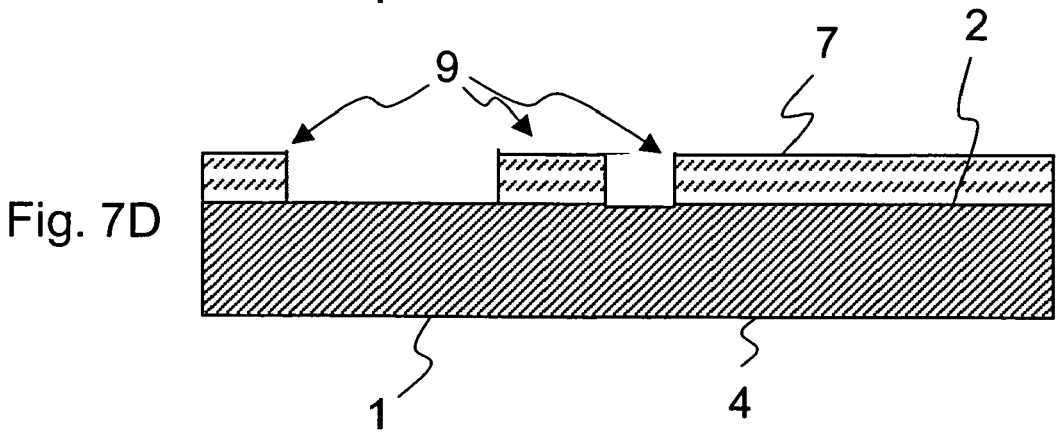

Finally, the photostructured layer 36 can be removed by application of a suitable solvent or etchant, so that a product having a substrate 1 with a metallic surface 2 and a structured evaporation-coating glass layer 7 applied to it and comprising structures 9 is obtained. The product or the coated substrate is illustrated in FIG. 7D.

Of course, the process according to the invention can also be used to coat nonplanar substrates, for example substrates with a nonplanar metallic surface, with an evaporation-coating glass layer.

Figure 8:
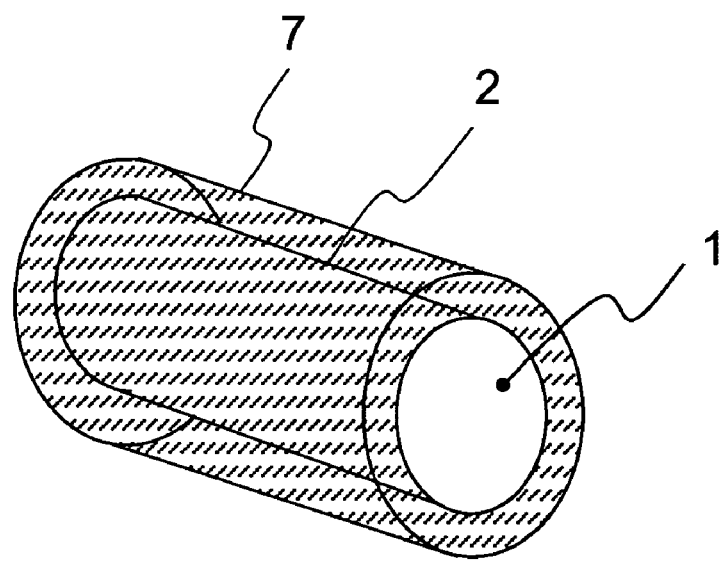
FIG. 8 shows an embodiment of a product according to the invention having a substrate with a coated metallic surface.

An exemplary embodiment of this type is shown in FIG. 8. The substrate 1 of the embodiment illustrated in FIG. 8 is, for example, cylindrical in form, with the metallic surface 2 coated with the evaporation-coating glass layer 7 forming the cylindrical lateral surface of the substrate 1. The evaporation-coating glass layer 7 covers the entire cylindrical surface 2. A coating of this type may, for example, be produced by the substrate being moved with respect to the coating source, such as for example the electron beam evaporator 26 shown in FIG. 4, during the coating operation. Specifically, a cylindrical substrate 1 can be coated with a continuous evaporation-coating glass layer 7 as shown in FIG. 8 on its cylindrical lateral surface by being rotated about its cylinder axis.

It will be clear to the person skilled in the art that the embodiments described above are to be understood as examples and that the invention is not restricted to these specific embodiments, but rather can be varied in numerous ways without departing from the scope of the invention.

The invention claimed is:

1. A process for producing a coated substrate having a metallic surface, comprising:
    producing at least one negatively structured first coating on the metallic surface;
    depositing a borosilicate glass comprising aluminum oxide and alkali metal oxide components as an hermetic evaporation-coating glass layer on the first coating;
    at least partially removing the at least one negatively structured first coating and the hermetic evaporation-coating glass layer thereon, wherein the hermetic evaporation-coating glass layer is deposited with a thickness that is less than the thickness of the negatively structured first coating, and whereby the first coating remains accessible at side edges of structures of the negatively structured first coating after deposition of the hermetic evaporation-coating glass; and
    at least partially uncovering the at least one negatively structured first coating.

2. The process as claimed in claim 1, wherein the hermetic evaporation-coating glass layer is deposited by electron beam evaporation.

3. The process as claimed in claim 1, wherein the step of producing the at least one negatively structured first coating on the metallic surface comprises the step of uncovering regions of the metallic surface that are to be coated.

4. The process as claimed in claim 1, wherein the step of producing the at least one negatively structured first coating comprises the step of resist-coating or printing.

5. The process as claimed in claim 1, wherein the step of at least partially removing the at least one negatively structured first coating comprises the step of lifting off regions of the hermetic evaporation-coating glass layer.

6. The process as claimed in claim 1, wherein the step of at least partially uncovering the at least one negatively structured first coating comprises the step of planarizing the metallic surface having the at least one negatively structured first coating and the hermetic evaporation-coating glass layer thereon.

7. The process as claimed in claim 1, wherein the step of partially uncovering the at least one negatively structured first coating comprises the step of mechanically removing material by a process selected from the group consisting of grinding, lapping, and polishing.

8. The process as claimed in claim 1, wherein depositing the hermetic evaporation-coating glass layer comprises evaporation coating through a mask.

9. The process as claimed in claim 1, further comprising depositing at least two hermetic evaporation-coating glass layers on the metallic substrate.

10. The process as claimed in claim 9, wherein the at least two evaporation-coating glass layers comprise different compositions.

11. The process as claimed in claim 1, wherein the hermetic evaporation-coating glass layer is deposited with a thickness in a range from 0.01 µm to 1 mm.

12. The process as claimed in claim 1, wherein the hermetic evaporation-coating glass layer has a composition that is varied while being deposited.

13. The process as claimed in claim 1, wherein depositing the hermetic evaporation-coating glass layer comprises co-evaporating evaporation-coating material from at least two sources.

14. The process as claimed in claim 1, further comprising heating the metallic substrate during deposition of the hermetic evaporation-coating glass layer.

15. The process as claimed in claim 1, wherein depositing the hermetic evaporation-coating glass layer occurs at a pressure that is at most $10^{-4}$ mbar.

16. The process as claimed in claim 1, further comprising structuring the hermetic evaporation-coating glass layer following the depositing operation.

17. The process as claimed in claim 16, wherein structuring the hermetic evaporation-coating glass layer comprises local etching.

18. The process as claimed in claim 1, further comprising moving the metallic substrate with respect to a coating source during the depositing step.

19. The process as claimed in claim 1, wherein depositing the hermetic evaporation-coating glass layer comprises plasma ion assisted deposition (PIAD).

20. A process for producing a coated substrate, comprising:
   producing a negatively structured first coating on a metallic surface of a solid metal substrate;
   depositing a borosilicate glass comprising aluminum oxide and alkali metal oxide components as an hermetic evaporation-coating glass layer on the negatively structured first coating;
   at least partially removing the negatively structured first coating and the hermetic evaporation-coating glass layer thereon, wherein the hermetic evaporation-coating glass layer is deposited with a thickness that is less than the thickness of the negatively structured first coating, and whereby the first coating remains accessible at side edges of structures of the negatively structured first coating after deposition of the hermetic evaporation-coating glass layer; and
   at least partially uncovering the negatively structured first coating.

21. The process as claimed in claim 20, wherein the step of producing the negatively structured first coating on the metallic surface comprises the step of uncovering regions of the metallic surface that are to be coated with the hermetic evaporation-coating glass layer.

22. The process as claimed in claim 20, wherein the step of at least partially removing the negatively structured first coating comprises the step of lifting off regions of the hermetic evaporation-coating glass layer.

* * * * *